(12) United States Patent
Yamazaki et al.

(10) Patent No.: US 12,202,941 B2
(45) Date of Patent: Jan. 21, 2025

(54) FILM, WIRING BOARD, AND METHOD FOR MANUFACTURING WIRING BOARD

(71) Applicant: FUJIFILM Corporation, Tokyo (JP)

(72) Inventors: Shohei Yamazaki, Kanagawa (JP); Yasuyuki Sasada, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 180 days.

(21) Appl. No.: 18/171,644

(22) Filed: Feb. 20, 2023

(65) Prior Publication Data

US 2023/0265246 A1    Aug. 24, 2023

(30) Foreign Application Priority Data

Feb. 24, 2022   (JP) .................................. 2022-027042

(51) Int. Cl.
*H05K 1/03*      (2006.01)
*C08G 63/685*   (2006.01)
*C08G 69/44*    (2006.01)

(52) U.S. Cl.
CPC ........... *C08G 69/44* (2013.01); *C08G 63/685* (2013.01); *H05K 1/0346* (2013.01); *H05K 2201/0145* (2013.01)

(58) Field of Classification Search
CPC ... H05K 2201/0145; H05K 2201/0195; H05K 1/0346; C08G 69/44; C08G 63/685
See application file for complete search history.

(56) References Cited

U.S. PATENT DOCUMENTS

| | | | | |
|---|---|---|---|---|
| 2003/0092875 | A1* | 5/2003 | Okamoto | C08G 69/44 528/272 |
| 2004/0055223 | A1* | 3/2004 | Ono | B24D 3/28 51/293 |
| 2011/0200816 | A1* | 8/2011 | Mizrahi | B32B 15/02 428/458 |
| 2018/0355168 | A1* | 12/2018 | Furuhara | D21F 11/00 |
| 2021/0269678 | A1* | 9/2021 | Amino | B32B 27/40 |

FOREIGN PATENT DOCUMENTS

JP   2020026474   2/2020

* cited by examiner

*Primary Examiner* — Sherman Ng
(74) *Attorney, Agent, or Firm* — JCIPRNET

(57) ABSTRACT

Provided are a film which includes at least a first resin layer containing aromatic polyester amide, and a second resin layer disposed on the first resin layer, and an elastic modulus of the second resin layer at 160° C. is less than 1.0 GPa.

10 Claims, No Drawings

FILM, WIRING BOARD, AND METHOD FOR MANUFACTURING WIRING BOARD

CROSS REFERENCE TO RELATED APPLICATIONS

The present application claims priority under 35 U.S.C. § 119 to Japanese Patent Application No. 2022-027042 filed on Feb. 24, 2022. The above application is hereby expressly incorporated by reference, in its entirety, into the present application.

BACKGROUND OF THE INVENTION

1. Field of the Invention

The present disclosure relates to a film, a wiring board, and a method for manufacturing a wiring board.

2. Description of the Related Art

In recent years, a frequency that is used in communication equipment tends to be extremely high. To suppress a transmission loss in a high frequency band, it has been required to decrease a specific dielectric constant and a dielectric loss tangent of an insulation material that is used in a circuit board.

In the related art, while polyimide is often used as the insulation material that is used in the circuit board, a liquid crystal polymer that has high heat resistance and low water absorption and is small in transmission loss in the high frequency band is attracting attention.

For example, JP2020-026474A describes a liquid crystalline polyester film that contains at least liquid crystalline polyester, in which, in a case where a first alignment degree is set to an alignment degree with respect to a first direction parallel to a main surface of the liquid crystalline polyester film, and a second alignment degree is set to an alignment degree with respect to a second direction parallel to the main surface and perpendicular to the first direction, a first alignment degree/second alignment degree that is a ratio of the first alignment degree and the second alignment degree is equal to or greater than 0.95 and equal to or less than 1.04, and a third alignment degree of the liquid crystalline polyester that is measured by a wide angle X-ray scattering method in a direction parallel to the main surface is equal to or greater than 60.0%.

SUMMARY OF THE INVENTION

An object of an embodiment of the present invention is to provide a film capable of suppressing distortion of a metal wire at the time of adhesion to the metal wire.

An object of another embodiment of the present invention is to provide a wiring board formed of the film and a method for manufacturing the same.

Means for attaining the above-described object includes the following aspects.

<1>
A film comprising:
a first resin layer comprising an aromatic polyester amide, and
a second resin layer disposed on the first resin layer,
in which an elastic modulus of the second resin layer at 160° C. is less than 1.0 GPa.

<2>
The film according to <1>, in which a ratio of an elastic modulus of the second resin layer at 25° C. to the elastic modulus of the second resin layer at 160° C. is equal to or greater than 10.

<3>
The film according to <1> or <2>, in which a thickness of the second resin layer is 5 µm to 50 µm.

<4>
The film according to any one of <1> to <3>, in which a surface energy of a side of the first resin layer on which the second resin layer is disposed is equal to or greater than 25 mN/m.

<5>
The film according to any one of <1> to <4>, in which the aromatic polyester amide comprises a unit represented by Formula 1, a unit represented by Formula 2, and a unit represented by Formula 3; and
  with respect to a total content of the unit represented by Formula 1, the unit represented by Formula 2, and the unit represented by Formula 3,
  the unit represented by Formula 1 has a content of 30% by mol to 80% by mol,
  the unit represented by Formula 2 has a content of 10% by mol to 35% by mol, and
  the unit represented by Formula 3 has a content of 10% by mol to 35% by mol,

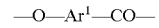  Formula 1

  Formula 2

  Formula 3 wherein in Formula 1 to Formula 3, $Ar^1$, $Ar^2$, and $Ar^3$ each independently represent a phenylene group, a naphthylene group, or a biphenylylene group.

<6>
The film according to any one of <1> to <5>, in which the elastic modulus of the second resin layer at 160° C. is equal to or less than 100 MPa.

<7>
A wiring board comprising:
a substrate,
a wiring pattern comprising wires and disposed on at least one surface of the substrate,
a second resin layer disposed on the wiring pattern so as to cover spaces between the wires and on the wires, and
a first resin layer disposed on the second resin layer,
in which the first resin layer comprises an aromatic polyester amide, and
an elastic modulus of the second resin layer at 160° C. is less than 1.0 GPa.

<8>
The wiring board according to <7>, in which a thickness of the wiring patterns is 3 µm to 40 µm.

<9>
The film according to <7> or <8>, in which the elastic modulus of the second resin layer at 160° C. is equal to or less than 100 MPa.

<10>
A method for manufacturing a wiring board, the method comprising a step of superimposing, on wires of a wiring pattern disposed on a substrate, a resin substrate comprising an aromatic polyester amides, and
  a step of heating the substrate with the wiring pattern and the resin substrate in a superimposed state to obtain a wiring board, in which a region from a surface on a side on which the substrate with the wiring pattern is superimposed to a thickness position corresponding to a thickness of the wiring pattern in the resin substrate has an elastic modulus less than 1.0 GPa at a heating temperature at a time of the heating in the superimposed state.

According to the embodiment of the present invention, a film capable of suppressing distortion of a metal wire at the time of adhesion to the metal wire is provided.

According to another embodiment of the present invention, a wiring board formed of the film and a method for manufacturing the same are provided.

DESCRIPTION OF THE PREFERRED EMBODIMENTS

Hereinafter, the content of the present disclosure will be described in detail. The description of the constituent elements described below will be made based on a representative embodiment of the present disclosure, but the present disclosure is not limited to such an embodiment.

In the present specification, "to" indicating a numerical range is used in a meaning including numerical values described before and after "to" as a lower limit value and an upper limit value.

In numerical ranges described in stages in the present disclosure, an upper limit value and a lower limit value described in one numerical range may be substituted with an upper limit value and a lower limit value of another numerical range described in another stage. In the numerical ranges described in the present disclosure, an upper limit value and a lower limit value of the numerical ranges may be substituted with values shown in examples.

In a case where substitution or substitution is not noted in regard to the notation of a group (atomic group) in the present specification, the group includes not only a group having no substituent but also a group having a substituent. For example, "alkyl group" denotes not only an alkyl group (unsubstituted alkyl group) having no substituent but also an alkyl group (substituted alkyl group) having a substituent.

In the present disclosure, a combination of two or more preferred aspects is a more preferred aspect.

A weight-average molecular weight (Mw) and a number-average molecular weight (Mn) in the present disclosure are molecular weights in terms of polystyrene used as a standard substance, which are detected by a solvent pentafluorophenol (PFP)/chloroform=1/2 (mass ratio) and a differential refractometer using gel permeation chromatography (GPC) analyzer using TSKgelSuperHM-H (product name manufactured by Tosoh Corporation) as a column, unless otherwise specified.

Film

A film of the present disclosure includes a first resin layer containing aromatic polyester amide, and a second resin layer disposed on the first resin layer, and an elastic modulus of the second resin layer at 160° C. is less than 1.0 GPa.

The present inventors have conducted intensive studies and have found that the above-described configuration is made, whereby it is possible to suppress distortion of a metal wire at the time of adhesion to the metal wire.

A detailed mechanism with which the above-described effect is obtained is unclear, but is presumed as follows.

In the film of the present disclosure, since the elastic modulus of the second resin layer at 160° C. is less than 1.0 GPa, it is considered that the second resin layer is easily deformed along a shape of a wiring pattern, and distortion of a metal wire is suppressed.

On the other hand, JP2020-026474A has no description regarding the second resin layer and does not focus on the elastic modulus.

First Resin Layer

In the film of the present disclosure, the first resin layer contains aromatic polyester amide.

Aromatic Polyester Amide

Aromatic polyester amide is resin having at least one aromatic ring and having an ester bond and an amide bond. Aromatic polyester amide included in a resin layer is preferably fully aromatic polyester amide among the substances from a viewpoint of heat resistance.

Aromatic polyester amide preferably contains a unit represented by Formula 1, a unit represented by Formula 2, and a unit represented by Formula 3.

    Formula 1

    Formula 2

    Formula 3

In Formula 1 to Formula 3, $Ar^1$, $Ar^2$, and $Ar^3$ each independently represent a phenylene group, a naphthylene group, or a biphenylylene group.

Hereinafter, the unit represented by Formula 1 and the like are also referred to as a "unit 1" and the like.

The unit 1 can be introduced, for example, using aromatic hydroxy carboxylic acid as a raw material.

The unit 2 can be introduced, for example, using aromatic dicarboxylic acid as a raw material.

The unit 3 can be introduced, for example, using aromatic hydroxylamine as a raw material.

Here, aromatic hydroxy carboxylic acid, aromatic dicarboxylic acid, aromatic diol, and aromatic hydroxylamine may be each independently substituted with a polycondensable derivative.

For example, aromatic hydroxy carboxylic acid and aromatic dicarboxylic acid can be substituted with aromatic hydroxy carboxylic acid ester and aromatic dicarboxylic acid ester by converting a carboxy group into an alkoxycarbonyl group or an aryloxycarbonyl group.

Aromatic hydroxy carboxylic acid and aromatic dicarboxylic acid can be substituted with aromatic hydroxy carboxylic acid halide and aromatic dicarboxylic acid halide by converting a carboxy group into a haloformyl group.

Aromatic hydroxy carboxylic acid and aromatic dicarboxylic acid can be substituted with aromatic hydroxy carboxylic acid anhydride and aromatic dicarboxylic acid anhydride by converting a carboxy group into an acyloxycarbonyl group.

Examples of a polycondensable derivative of a compound having a hydroxy group, such as aromatic hydroxy carboxylic acid or aromatic hydroxyamine, include a substance (acylated substance) obtained by acylating the hydroxy group to convert the hydroxy group into an acyloxy group.

For example, aromatic hydroxy carboxylic acid and aromatic hydroxylamine can be each substituted with an acylated substance by acylating a hydroxy group to convert the hydroxy group into an acyloxy group.

An example of a polycondensable derivative of aromatic hydroxylamine is a substance (acylated substance) obtained by acylating an amino group to convert the amino group into an acylamino group.

For example, aromatic hydroxyamine can be substituted with an acylated substance by acylating an amino group to convert the amino group into an acylamino group.

In Formula 1, $Ar^1$ is preferably a p-phenylene group, a 2,6-naphthylene group, or a 4,4'-biphenylylene group, and more preferably a 2,6-naphthylene group.

In a case where $Ar^1$ is a p-phenylene group, the unit 1 is, for example, a unit derived from p-hydroxybenzoic acid.

In a case where $Ar^1$ is a 2,6-naphthylene group, the unit 1 is, for example, a unit derived from 6-hydroxy-2-naphthoic acid.

In a case where $Ar^1$ is a 4,4'-biphenylylene group, the unit 1 is, for example, a unit derived from 4'-hydroxy-4-biphenylcarboxylic acid.

In Formula 2, $Ar^2$ is preferably a p-phenylene group, an m-phenylene group, or a 2,6-naphthylene group, and more preferably an m-phenylene group.

In a case where $Ar^2$ is a p-phenylene group, the unit 2 is, for example, a unit derived from terephthalic acid.

In a case where $Ar^2$ is an m-phenylene group, the unit 2 is, for example, a unit derived from isophthalic acid.

In a case where $Ar^2$ is a 2,6-naphthylene group, the unit 2 is, for example, a unit derived from 2,6-naphthalenedicarboxylic acid.

In Formula 3, $Ar^3$ is preferably a p-phenylene group or a 4,4'-biphenylylene group, and more preferably a p-phenylene group.

In a case where $Ar^3$ is a p-phenylene group, the unit 3 is, for example, a unit derived from p-aminophenol.

In a case where $Ar^3$ is a 4,4'-biphenylylene group, the unit 3 is, for example, a unit derived from 4-amino-4'-hydroxybiphenyl.

With respect to a total content of the unit 1, the unit 2, and the unit 3, a content of the unit 1 is preferably equal to or greater than 30% by mol, a content of the unit 2 is preferably equal to or less than 35% by mol, and a content of the unit 3 is preferably equal to or less than 35% by mol.

The content of the unit 1 is preferably 30% by mol to 80% by mol, more preferably 30% by mol to 60% by mol, and particularly preferably 30% by mol to 40% by mol, with respect to the total content of the unit 1, the unit 2, and the unit 3.

The content of the unit 2 is preferably 10% by mol to 35% by mol, more preferably 20% by mol to 35% by mol, and particularly preferably 30% by mol to 35% by mol, with respect to the total content of the unit 1, the unit 2, and the unit 3.

The content of the unit 3 is preferably 10% by mol to 35% by mol, more preferably 20% by mol to 35% by mol, and particularly preferably 30% by mol to 35% by mol, with respect to the total content of the unit 1, the unit 2, and the unit 3.

The total content of the units is a value obtained by totaling a substance amount (mol) of each unit. The substance amount of each unit is calculated by dividing a mass of each unit constituting aromatic polyester amide by a formula weight of each unit.

A ratio of the content of the unit 2 and the content of the unit 3 is preferably 0.9/1 to 1/0.9, more preferably 0.95/1 to 1/0.95, and still more preferably 0.98/1 to 1/0.98 in a case of being represented by [content of unit 2]/[the content of the unit 3] (mol/mol).

Aromatic polyester amide may have two kinds or more of the unit 1 to the unit 3 each independently. Alternatively, aromatic polyester amide may have other units other than the unit 1 to the unit 3. A content of other units is preferably equal to or less than 10% by mol, and more preferably equal to or less than 5% by mol, with respect to a total content of all units.

Aromatic polyester amide is preferably produced by subjecting a source monomer corresponding to the unit constituting the aromatic polyester amide to melt polymerization.

A melting point of aromatic polyester amide is preferably equal to or higher than 250° C., more preferably 250° C. to 350° C., and still more preferably 260° C. to 330° C.

The melting point is measured using a differential scanning calorimetry apparatus.

The weight-average molecular weight of aromatic polyester amide is preferably equal to or less than 1,000,000, more preferably 3,000 to 300,000, still more preferably 5,000 to 100,000, and particularly preferably 5,000 to 30,000.

The first resin layer may contain only one kind of aromatic polyester amide or may contain two kinds or more of aromatic polyester amide.

A content of aromatic polyester amide is preferably equal to or greater than 50% by mass, more preferably equal to or greater than 70% by mass, and still more preferably equal to or greater than 90% by mass, with respect to a total amount of the first resin layer. An upper limit value of the content of aromatic polyester amide is not particularly limited, and may be 100% by mass.

Filler

The first resin layer may contain a filler.

The filler may be particulate or fibrous, and may be an inorganic filler or an organic filler.

As the inorganic filler, a known inorganic filler can be used.

Examples of a material of the inorganic filler include boron nitride (BN), aluminum oxide ($Al_2O_3$), aluminum nitride (AlN), titanium dioxide ($TiO_2$), silicon dioxide ($SiO_2$), barium titanate, strontium titanate, aluminum hydroxide, calcium carbonate, and a material including two kinds or more thereof.

From a viewpoint of decreasing the dielectric loss tangent of the film, the inorganic filler preferably includes at least one kind selected from the group consisting of boron nitride, titanium dioxide, and silicon dioxide, and is more preferably a material (so-called silica particles) including silicon dioxide.

Alternatively, the inorganic filler may be hollow particles. As a hollow inorganic filler, hollow particles (glass hollow particles) including silicon dioxide are preferably used. An example of hollow particles is a glass bubbles series (for example, glass bubbles S60HS) manufactured by 3M Japan Limited.

The inorganic filler is preferably silica particles that are solid particles including silicon dioxide or glass hollow particles that are hollow particles including silicon dioxide.

From a viewpoint of a thermal expansion coefficient and adhesiveness to metal, an average particle diameter of the inorganic filler is preferably 5 nm to 40 μm, more preferably 1 μm to 35 μm, still more preferably 5 μm to 35 μm, and particularly preferably 10 μm to 35 μm. In a case where particles or fibers are flat, the average particle diameter indicates a length in a short side direction.

The average particle diameter of the inorganic filler is a particle diameter (D50) in a case where volume accumulation from a small diameter side is 50% in a volume-based particle size distribution. D50 is a value that is measured by dynamic light scattering.

As the organic filler, a known organic filler can be used.

Examples of a material of the organic filler include polyethylene, polystyrene, urea-formalin filler, polyester, cellulose, acrylic resin, fluororesin, cured epoxy resin, crosslinked benzoguanamine resin, crosslinked acrylic resin, a liquid crystal polymer (LCP), and a material including two kinds or more thereof.

From a viewpoint of decreasing the dielectric loss tangent of the film, the organic filler preferably includes at least one selected from the group consisting of a liquid crystal polymer, fluororesin, and polyethylene, more preferably includes at least one kind selected from the group consisting of liquid crystalline polyester, polytetrafluoroethylene, and polyethylene, and still more preferably includes liquid crystalline polyester.

Here, the organic filler (also referred to as liquid crystal polymer particles) including the liquid crystal polymer can be produced, for example, by polymerizing the liquid crystal polymer and pulverizing the liquid crystal polymer into powder by a pulverizer or the like.

Alternatively, the organic filler may be fibrous, such as nanofibers, or may be hollow resin particles.

From a viewpoint of a thermal expansion coefficient and adhesiveness to metal, an average particle diameter of the organic filler is preferably 5 nm to 20 more preferably 1 μm to 20 still more preferably 5 μm to 15 and particularly preferably 10 μm to 15 μm.

The average particle diameter of the organic filler is a particle diameter (D50) in a case where volume accumulation from a small diameter side is 50% in a volume-based particle size distribution. D50 is a value that is measured by dynamic light scattering.

In a case where the first resin layer contains the filler, a content of the filler is preferably 20% by volume to 70% by volume, and more preferably 30% by volume to 60% by volume, with respect to a total volume of the first resin layer.

The first resin layer may contain components other than aromatic polyester amide and the filler as long as the effects of the present disclosure are not significantly impaired.

As other components, known additives can be used. Examples of other components include a leveling agent, an antifoaming agent, an antioxidant, an ultraviolet absorbent, a flame retardant, and a colorant.

The first resin layer may be configured with only one layer or may be configured with two layers or more.

For example, the first resin layer may include a layer A containing aromatic polyester amide and epoxy resin, and a layer B containing aromatic polyester amide, and the second resin layer may be disposed on the layer B.

Physical Property

Surface Energy

From a viewpoint of adhesiveness to the second resin layer, surface energy of a side of the first resin layer on which the second resin layer is disposed is preferably equal to or greater than 25 mN/m, and more preferably equal to or greater than 30 mN/m. An upper limit value of the surface energy is not particularly limited and is, for example, 1000 mN/m.

In the present disclosure, the surface energy is calculated by the Owens-Wendt method. A specific calculation method of the surface energy is as follows.

Each of contact angles of water and diiodomethane with respect to the surface of the first resin layer is measured using a contact angle meter. As the contact angle meter, for example, DropMaster series manufactured by Kyowa Interface Science Co., Ltd. can be used.

The surface energy of the film is calculated by the Owens-Wendt method using measured values of the contact angles of water and diiodomethane with respect to the surface of the first resin layer and dispersive components and polar components of water and diiodomethane.

The Owens-Wendt Method is described in D. K. Owens and R. C. Wendt, Journal of applied polymer science Vol. 13, PP. 1741-1747, (1969).

Hereinafter, a specific calculation method will be described. In a case where a liquid is dropped on a solid surface (in this case, the film), in regard to each parameter at an interface of the solid surface and the liquid, the following expressions are established.

Expression 1 described below is known as the Young's equation.

Expression 2 described below is known as the Dupre equation.

Expression 3, Expression 4, and Expression 5 described below are known as the Owens-Wendt method.

$$\gamma_S = \gamma_L \cos\theta + \gamma_{SL} \tag{1}$$

$$W = \gamma_S + \gamma_L - \gamma_{SL} \tag{2}$$

$$\gamma_S = \gamma_S^d + \gamma_S^h \tag{3}$$

$$\gamma_L = \gamma_L^d + \gamma_L^h \tag{4}$$

$$W = 2(\gamma_S^d \gamma_L^d)^{1/2} + 2(\gamma_S^h \gamma_L^h)^{1/2} \tag{5}$$

In Expression 1 to Expression 5, details of each symbol are as follows.

θ . . . contact angle of liquid with respect to surface of first resin layer $\gamma_S$ . . . surface energy of first resin layer $\gamma_L$ . . . surface energy of liquid $\gamma_{SL}$ . . . interface energy of film and liquid W . . . work of adhesion $\gamma_S^d$ . . . dispersive component of surface energy of first resin layer $\gamma_S^h$ . . . polar component of surface energy of first resin layer $\gamma_L^d$ . . . dispersive component of surface energy of liquid $\gamma_L^h$ . . . polar component of surface energy of liquid From Expression 1 to Expression 5 described above, Expression 6 described below is obtained.

$$(\gamma_S^d \gamma_L^d)^{1/2} + (\gamma_S^h \gamma_L^h)^{1/2} = \gamma_L(1+\cos\theta)/2 \tag{6}$$

Water and diiodomethane are used as the liquid in Expression 6, and Expression 6A and Expression 6B are made.

$$(\gamma_S^d \gamma_{L1}^d)^{1/2} + (\gamma_S^h \gamma_{L1}^h)^{1/2} = \gamma_{L1}(1+\cos\theta 1)/2 \tag{6A}$$

$$(\gamma_S^d \gamma_{L2}^d)^{1/2} + (\gamma_S^h \gamma_{L2}^h)^{1/2} = \gamma_{L2}(1+\cos\theta 2)/2 \tag{6B}$$

In Expression 6A and Expression 6B, details of each symbol are as follows.

θ1 . . . contact angle of water with respect to surface of first resin layer

θ2 . . . contact angle of diiodomethane with respect to surface of first resin layer $\gamma_{L1}$ . . . surface energy (72.8 mN/m) of water $\gamma_{L1}^d$ . . . dispersive component (21.8 mN/m) of surface energy of water $\gamma_{L1}^h$ . . . polar component (51.0 mN/m) of surface energy of water $\gamma_{L2}$ . . . surface energy (50.8 mN/m) of diiodomethane $\gamma_{L2}^d$ . . . dispersive component (50.8 mN/m) of surface energy of diiodomethane $\gamma_{L2}^h$ . . . polar component (0 mN/m) of surface energy of diiodomethane A value in parentheses is a value described in the document.

θ1, θ2, $\gamma_{L1}$, $\gamma_{L1}^d$, $\gamma_{L1}^h$, $\gamma_{L2}$, $\gamma_{L2}^d$, and $\gamma_{L2}^h$ are substituted into Expression 6A and Expression 6B, whereby $\gamma_S^d$ and $\gamma_S^h$ are calculated.

As θ1 and θ2, the measured values by the above-described measurement method are used.

The calculated $\gamma_S^d$ and $\gamma_S^h$ are substituted into Expression 3, whereby the surface energy $\gamma_S$ of the film is calculated.

Thickness

A thickness of the first resin layer is preferably 6 μm to 200 more preferably 12 μm to 100 and still more preferably 20 μm to 60 μm from a viewpoint of strength, a dielectric loss tangent, and adhesiveness to a metal layer.

A thickness of each layer in the film is measured by the following method.

The film is cut with a microtome, and a cross section is observed with an optical microscope. Three or more cross section samples are cut, and a thickness of a layer to be measured in each cross section is measured at three points or more. An average value of the measured values is calculated, and an average thickness is employed.

Second Resin Layer

In the film of the present disclosure, the second resin layer is disposed on the first resin layer, and the elastic modulus of the second resin layer at 160° C. is less than 1.0 GPa.

In the present disclosure, the elastic modulus means a storage elastic modulus. The elastic modulus at 160° C. is an elastic modulus that is measured under an environment of 160° C.

The elastic modulus is measured by the following method.

The film is embedded in UV resin and is cut with a microtome to produce a sample for cross section evaluation. Successively, observation is performed in a VE-AFM mode using a scanning probe microscope (product name "SPA400", manufactured by SII NanoTechnology Inc.), and the elastic modulus of the second resin layer is measured.

From a viewpoint of further suppressing wiring distortion, the elastic modulus of the second resin layer at 160° C. is preferably equal to or less than 100 MPa, and more preferably equal to or less than 10 MPa. A lower limit value of the elastic modulus is not particularly limited, and is, for example, 0.01 MPa.

From a viewpoint of strength, the elastic modulus of the second resin layer at 25° C. is preferably equal to or greater than 100 MPa, more preferably equal to or greater than 200 MPa, and still more preferably equal to or greater than 500 MPa. An upper limit value of the elastic modulus is not particularly limited, and is, for example, 10000 MPa.

From a viewpoint of further suppressing wiring distortion and improving strength, a ratio of the elastic modulus of the second resin layer at 25° C. to the elastic modulus of the second resin layer at 160° C. is preferably equal to or greater than 10, more preferably equal to or greater than 20, and still more preferably equal to or greater than 50. An upper limit value of the ratio is not particularly limited, and is, for example, 100.

A thickness of the second resin layer is preferably 5 μm to 50 μm, more preferably 10 μm to 40 μm, and still more preferably 15 μm to 30 μm from a viewpoint of strength, a dielectric loss tangent, and adhesiveness to a metal layer.

The elastic modulus of the second resin layer at 160° C. may be less than 1.0 GPa, and the type of resin contained in the second resin layer is not particularly limited. Examples of resin contained in the second resin layer include polyolefin, polystyrene, polyethylene, and polypropylene.

In the film of the present disclosure, while another layer may be disposed between the first resin layer and the second resin layer, from a viewpoint of decreasing the dielectric loss tangent, the second resin layer is preferably disposed directly on the surface of the first resin layer.

The film of the present disclosure can be manufactured by a known method. For example, a solution for a first resin layer containing aromatic polyester amide is coated on a substrate by a casting method to form the first resin layer, then, a sheet for a second resin layer is adhered onto the first resin layer, and the substrate is peeled, whereby the first resin layer and the second resin layer can be obtained as a film. A metal substrate is used as the substrate, whereby a laminate having a metal layer and the film can be obtained. The substrate may not be peeled depending on purposes.

The solution for a first resin layer preferably contains aromatic polyester amide and a solvent.

Examples of the solvent include halogenated hydrocarbon, such as dichloromethane, chloroform, 1,1-dichloroethane, 1,2-dichloroethane, 1,1,2,2-tetrachloroethane, 1-chlorobutane, chlorobenzene, or o-dichlorobenzene; halogenated phenol, such as p-chlorophenol, pentachlorophenol, or pentafluorophenol; ether, such as diethyl ether, tetrahydrofuran, or 1,4-dioxane; ketone, such as acetone or cyclohexanone; ester, such as ethyl acetate or γ-butyrolactone; carbonate, such as ethylene carbonate or propylene carbonate; amine, such as triethylamine; a nitrogen-containing heterocyclic aromatic compound, such as pyridine; nitrile, such as acetonitrile or succinonitrile; amide, such as N,N-dimethylformamide, N,N-dimethylacetamide, or N-methylpyrrolidone; a urea compound, such as tetramethylurea; a nitro compound, such as nitromethane or nitrobenzene; a sulfur compound, such as dimethyl sulfoxide or sulfolane; and phosphorus compound, such as hexamethylphosphoramide or tri-n-butyl phosphate.

The solvent preferably contains an aprotic compound, and in particular, an aprotic compound having no halogen atom among the solvents for low corrosiveness and easiness to handle. A proportion of the aprotic compound to the whole solvent is preferably 50% by mass to 100% by mass, more preferably 70% by mass to 100% by mass, and particularly preferably 90% by mass to 100% by mass. For easiness to dissolve aromatic polyester amide, the aprotic compound is preferably amide, such as N,N-dimethylformamide, N,N-dimethylacetamide, or N-methylpyrrolidone, or ester, such as γ-butyrolactone, and more preferably N,N-dimethylformamide, N,N-dimethylacetamide, or N-methylpyrrolidone.

After the solution for a first resin layer is coated on the substrate, heating is preferably performed. A heating temperature is, for example, 40° C. to 100° C. A heating time is, for example, 10 minutes to 5 hours.

After the first resin layer is formed on the substrate, and annealing treatment is preferably performed on a laminate including the substrate and the first resin layer. The annealing treatment is preferably performed at 250° C. to 350° C. for 2.5 hours to 10 hours. The annealing treatment is preferably performed under an inert gas atmosphere, such as nitrogen.

The adhesion of the sheet for a second resin layer to the first resin layer can be performed using a known method.

Wiring Board

A wiring board of the present disclosure comprises a substrate, wiring patterns disposed on at least one surface of the substrate, a second resin layer disposed between the wiring patterns and on the wiring patterns, and a first resin layer disposed on the second resin layer. The first resin layer contains aromatic polyester amide, and an elastic modulus of the second resin layer at 160° C. is less than 1.0 GPa.

Since the elastic modulus of the second resin layer at 160° C. disposed between the wiring patterns and on the wiring patterns is less than 1.0 GPa, wiring distortion is suppressed.

A preferred aspect of the first resin layer and the second resin layer in the wiring board is the same as the first resin layer and the second resin layer in the above-described film.

A material of the wiring patterns is not particularly limited, but is preferably metal, and is more preferably silver or copper.

A thickness of the wiring pattern is not particularly limited, and is preferably 3 μm to 40 μm, and more preferably 5 μm to 20 μm.

In regard to the thickness of the wiring pattern, the wiring board is cut with a microtome, and a cross section is observed with an optical microscope. Three or more cross section samples are cut, and the thickness of the wiring pattern in each cross section is measured at three points or more. An average value of the measured values is calculated, and an average thickness is employed.

From a viewpoint of further suppressing wiring distortion, the thickness of the second resin layer is preferably thicker than the thickness of the wiring pattern.

The type of the substrate in the wiring board is not particularly limited, but is preferably the film of the present disclosure including the first resin layer and the second resin layer from a viewpoint of easiness of manufacturing.

The wiring board of the present disclosure may further comprise a metal layer on the first resin layer. Examples of metal contained in the metal layer include copper, silver, gold, and an alloy thereof. The metal layer is preferably a copper layer among such metal.

Manufacturing Method of Wiring Board

A manufacturing method of the wiring board of the present disclosure includes a step of superimposing a resin substrate containing aromatic polyester amide on wiring patterns of a substrate with wiring patterns, and a step of heating the substrate with wiring patterns and the resin substrate in a superimposed state to obtain a wiring board, and the resin substrate has an elastic modulus less than 1.0 GPa at a heating temperature at the time of heating in the superimposed state in a region from a surface on a side on which the substrate with wiring patterns is superimposed, to a thickness position corresponding to a thickness of the wiring pattern.

Superimposition Step

In the manufacturing method of the wiring board according to the present disclosure, the resin substrate containing aromatic polyester amide is superimposed on the wiring patterns of the substrate with wiring patterns.

In a case of superimposing the resin substrate, the resin substrate may be just placed on the wiring patterns or the resin substrate may be pressure-welded onto the wiring patterns while applying pressure and pressing the resin substrate.

In the substrate with wiring patterns, the wiring patterns may be formed only on one surface of the substrate or the wiring patterns may be formed on both surfaces of the substrate.

The substrate with wiring patterns can be produced using a known method. For example, a metal layer is adhered to at least one surface of the substrate to obtain a laminate comprising the substrate and the metal layer disposed on at least one surface of the substrate. A known pattering treatment is performed on the metal layer, whereby the substrate with wiring patterns is obtained.

A preferred aspect of the substrate and the wiring patterns in the substrate with wiring patterns is the same as the preferred aspect of the substrate and the wiring pattern described in the section of the wiring board.

The resin substrate has an elastic modulus at the heating temperature at the time of heating in the superimposed state in the region from the surface on the side on which the substrate with wiring patterns is superimposed, to the thickness position corresponding to the thickness of the wiring pattern less than 1.0 GPa, preferably equal to or less than 100 MPa, and more preferably equal to or less than 10 MPa. A lower limit value of the elastic modulus is not particularly limited, and is, for example, 0.01 MPa. A measurement method of the elastic modulus is as described above.

The resin substrate has an elastic modulus at 25° C. preferably equal to or greater than 100 MPa, more preferably equal to or greater than 200 MPa, and still more preferably equal to or greater than 500 MPa, in the region from the surface on the side on which the substrate with wiring patterns is superimposed, to the thickness position corresponding to the thickness of the wiring pattern. An upper limit value of the elastic modulus is not particularly limited, and is, for example, 10000 MPa. A measurement method of the elastic modulus is as described above.

Heating Step

In the manufacturing method of the wiring board of the present disclosure, after the above-described superimposition step, the substrate with wiring patterns and the resin substrate are heated in the superimposed state to obtain a wiring board.

A heating method is not particularly limited, and heating can be performed, for example, using a heat pressing machine.

The heating temperature in heating the substrate with wiring patterns and the resin substrate in the superimposed state is preferably 50° C. to 300° C., and more preferably 100° C. to 250° C.

It is preferable that pressure is applied in heating the substrate with wiring patterns and the resin substrate in the superimposed state. The pressure is preferably 0.5 MPa to 30 MPa, and more preferably 1 MPa to 20 MPa.

A heating time in heating the substrate with wiring patterns and the resin substrate in the superimposed state is not particularly limited, and is, for example, one minute to two hours.

The resin substrate is preferably the film of the present disclosure including the first resin layer and the second resin layer. In the step of superimposing the resin substrate, the resin substrate is preferably superimposed such that the second resin layer side is in contact with the substrate with wiring patterns.

The wiring board of the present disclosure can be used for various purposes, and the wiring board of the present disclosure can be suitably used in a flexible printed circuit board among the purposes.

EXAMPLES

Hereinafter, while the present disclosure will be more specifically described by examples, the present disclosure is not limited to the following examples within a range without departing from the gist thereof Synthesis of Aromatic Polyester Amide 940.9 g (5.0 mol) of 6-hydroxy-2-naphthoic acid, 415.3 g (2.5 mol) of isophthalic acid, 377.9 g (2.5 mol) of acetaminophen, 867.8 g (8.4 mol) of acetic anhydride are put in a reactor comprising a stirring device, a torque meter, a nitrogen gas introduction pipe, a thermometer, and a reflux condenser, gas in the reactor is substituted with nitrogen gas, a temperature increases from a room temperature (23° C., the same applies hereinafter) to 140° C. over 60 minutes while stirring under a nitrogen gas flow, and refluxing is performed at 140° C. for three hours.

Next, the temperature increases from 150° C. to 300° C. over five hours while by-produced acetic acid and unreacted acetic anhydride are distilled and is maintained at 300° C. for 30 minutes. Thereafter, a content is taken out from the reactor and is cooled to the room temperature. An obtained solid is pulverized by a pulverizer, and powdered aromatic polyester amide A1a is obtained. A flow beginning temperature of aromatic polyester amide A1a is 193° C. Aromatic polyester amide A1a is fully aromatic polyester amide.

Aromatic polyester amide A1a is subjected to solid polymerization by increasing the temperature from the room temperature to 160° C. over two hours and 20 minutes, next increasing the temperature from 160° C. to 180° C. over three hours and 20 minutes, and maintaining the temperature at 180° C. for five hours under a nitrogen atmosphere, and then, is cooled. Next, aromatic polyester amide A1a is pulverized by a pulverizer, and powdered aromatic polyester amide A1b is obtained. Allow beginning temperature of aromatic polyester amide A1b is 220° C.

Aromatic polyester amide A1b is subjected to solid polymerization by increasing the temperature from the room temperature to 180° C. over one hour and 25 minutes, next increasing the temperature from 180° C. to 255° C. over six hours and 40 minutes, and maintaining the temperature at 255° C. for five hours under a nitrogen atmosphere, and then, is cooled, and powdered aromatic polyester amide A1 (fully aromatic polyester amide) is obtained.

A flow beginning temperature of aromatic polyester amide A1 is 302° C. A melting point of aromatic polyester amide A1 is measured using a differential scanning calorimetry apparatus, and is 311° C.

Preparation of Solution for First Resin Layer
Solution for Layer A

The above-described aromatic polyester amide A1 (70 g) and N,N-diglycidyl-4-glycidyloxyaniline (0.14 g: B1 in Table 1) as an epoxy compound are mixed, and a solution for a layer A containing 97.6% by mass of aromatic polyester amide A1 and 2.4% by mass of the epoxy compound in solid contents is obtained.

Solution for Layer B

The aromatic polyester amide A1 (80 g) is added to 920 g of N-methylpyrrolidone, and stirring is performed at 140° C. for four hours under a nitrogen atmosphere. A solution for a layer B in which a concentration of solid contents is 8.0% by mass is obtained.

Production of Sheet for Second Resin Layer
Sheet C1 for Second Resin Layer 100 parts by mass of a propylene-butene random copolymer manufactured with metallocene catalyst as a polymerization catalyst and composed of 75% by mol of a propylene unit and 25% by mol of a butene unit, 22 parts by mass of maleic acid anhydride, and 6 parts by mass of di-t-butyl peroxide are dissolved in toluene. The solution increases in temperature to 140° C. in a 1 L autoclave. The solution is further stirred at 140° C. for three hours. Next, an obtained reaction liquid is cooled, the reaction liquid is poured into a container in which a lot of methyl ethyl ketone is put, and resin is precipitated. Thereafter, a remaining unreacted substance and the like are separated by centrifugal separation and purification is performed. Recovered resin is dried at 70° C. for five hours under reduced pressure, whereby modified polyolefin-based resin C1-1 is manufactured. Modified polyolefin-based resin C1-1 has a weight-average molecular weight of 55,000 and an acid value of 30 mgKOH/g. A content proportion of a graft portion constituting modified polyolefin-based resin C1-1 is 5.2% by mass.

Bisphenol A novolak type epoxy resin (product name "EPICLON N-865", manufactured by DIC Corporation), dicyclopentadiene skeleton-containing epoxy resin (product name "EPICLON HP-7200", manufactured by DIC Corporation), 1-(2-hydroxy-3-trimethoxysilylpropoxypropyl)-imidazole, a phenol-based antioxidant (product name "ADEKASTAB A330", manufactured by Adeka Corporation), aluminum dimethylphosphinate (product name "Exolit OP935", manufactured by CLAMANT), copper powder (product name "FCC-115A", manufactured by Fukuda Metal Foil &Powder Co., Ltd.), an imidazole-based curing accelerator (product name "CUREZOL C11-Z", manufactured by Shikoku Chemicals Corporation), fumed silica (product name "AEROSIL R974", manufactured by Nippon Aerosil Co., Ltd.), and a mixed solvent composed of methylcyclohexane, toluene, methyl ethyl ketone, and methanol are added to the above-described modified polyolefin-based resin C1-1 at a ratio of 100:5:10:1:1:10:30:0.3:10:300, and are stirred for six hours under heating to 60° C., and a precursor of a sheet C1 for second resin is obtained.

The precursor of a sheet C1 for second resin is roll-coated on a surface of a releasable PET film having a thickness of 35 μm such that a thickness after drying is 20 and is dried at 140° C. for two minutes, whereby a sheet C1 for second resin is obtained.

Sheet C2 for Second Resin Layer 100 parts by mass of a hydrogenated styrene butadiene block copolymer (product name "TUFTEC H1052", manufactured by Asahi Kasei Corporation), 1.5 parts by mass of maleic anhydride, 0.8 parts by mass of lauryl methacrylate, and 1.2 parts by mass of di-t-butyl peroxide are kneaded and reacted using a twin-screw extruder in which a maximum temperature of a cylinder part is set to 170° C. Thereafter, degassing is performed under reduced pressure in the extruder to remove a remaining unreacted substance, thereby manufacturing modified polyolefin-based resin C2-1. Modified polyolefin-based resin C2-1 has a weight-average molecular weight of 60,000 and an acid value of 15 mgKOH/g. A content proportion of a graft portion constituting modified polyolefin-based resin C2-1 is 2.6% by mass.

Bisphenol A novolak type epoxy resin (product name "EPICLON N-865", manufactured by DIC Corporation), dicyclopentadiene skeleton-containing epoxy resin (product name "EPICLON HP-7200", manufactured by DIC Corporation), 1-(2-hydroxy-3-trimethoxysilylpropoxypropyl)-imidazole, a phenol-based antioxidant (product name "ADEKASTAB A330", manufactured by Adeka Corporation), aluminum dimethylphosphinate (product name "Exolit OP935", manufactured by CLARIANT), copper powder (product name "FCC-115A", manufactured by Fukuda Metal Foil &Powder Co., Ltd.), an imidazole-based curing accelerator (product name "CUREZOL C11-Z", manufactured by Shikoku Chemicals Corporation), fumed silica (product name "AEROSIL R974", manufactured by Nippon Aerosil Co., Ltd.), and a mixed solvent composed of methylcyclohexane, toluene, methyl ethyl ketone, and methanol are added to the above-described modified polyolefin-based resin C2-1 at a ratio of 100:5:10:1:1:10:30:0.3:10:300, and are stirred for six hours under heating to 60° C., and a precursor of a sheet C2 for second resin is obtained.

The precursor of a sheet C2 for second resin is roll-coated on a surface of a releasable PET film having a thickness of 35 μm such that a thickness after drying is 20 μm, and is dried at 140° C. for two minutes, whereby a sheet C2 for second resin is obtained.

Sheet C3 and C4 for Second Resin Layer

Sheets C3 and C4 for a second resin layer are obtained by pressurizing the respective polymers described below at 120° C. and molding the polymers in a sheet shape.

C3: ethylene-acrylic acid copolymer (product name "Flow Beads EA-209", manufactured by SUMITOMO SEIKA CHEMICALS CO., LTD.)

C4: high-density polyethylene (product name "Flow Beads RE-3040", manufactured by SUMITOMO SEIKA CHEMICALS CO., LTD.)

Example 1 to Example 4

The solution for a layer A is coated on an electrolytic copper foil (product name "CF-T9DA-SV-18", surface roughness Sa=0.22 μm, manufactured by Fukuda Metal Foil &Powder Co., Ltd.). Drying is performed at 150° C. for one hour, and the layer A composed of aromatic polyester amide and epoxy resin (a crosslinked substance of an epoxy compound) is formed on the electrolytic copper foil. A thickness of the layer A is 3 μm.

The solution for a layer B is coated on the layer A. Drying is performed at 50° C. for three hours, and the layer B composed of aromatic polyester amide is formed on the layer A. A thickness of the layer B is 45 μm. With this, the first resin layer including the layer A and the layer B is formed on the copper layer.

Annealing treatment is performed on a precursor with the first resin layer formed on the copper layer, at 300° C. for three hours under a nitrogen atmosphere, and a laminate in which the first resin layer is formed on the copper layer is obtained. The sheet for a second resin layer described in Table 1 is adhered to the first resin layer, and a laminate (single-sided copper-clad laminate) in which a film including the first resin layer and the second resin layer is formed on the copper layer is obtained.

Example 5 to Example 8

The solution for a layer B is coated on an electrolytic copper foil (product name "CF-T4X-SV-18", surface roughness Sa=1.0 μm, manufactured by Fukuda Metal Foil &Powder Co., Ltd.). Drying is performed at 50° C. for three hours, and the layer B composed of aromatic polyester amide is formed on the electrolytic copper foil. A thickness of the layer B is 45 μm. With this, the first resin layer including the layer B is formed on the copper layer.

Annealing treatment is performed on a precursor in which the first resin layer is formed on the copper layer, at 300° C. for three hours under a nitrogen atmosphere. The sheet for a second resin layer described in Table 1 is adhered to the first resin layer, and a laminate (single-sided copper-clad laminate) in which a film including the first resin layer and the second resin layer is formed on the copper layer is obtained.

Comparative Example 1

A laminate (single-sided copper-clad laminate) in which the first resin layer is formed on the copper layer is obtained by the same method as in Example 1. Thereafter, the sheet for a second resin layer is not adhered.

Comparative Example 2

A laminate (single-sided copper-clad laminate) in which the first resin layer is formed on the copper layer is obtained in the same method as in Example 5. Thereafter, the sheet for a second resin layer is not adhered.

Production of Wiring Board

An electrolytic copper foil (product name "CF-T9DA-SV-18", thickness 18 surface roughness Rz of adhesion surface (treatment surface) 0.85 manufactured by Fukuda Metal Foil &Powder Co., Ltd.) is placed to be in contact with a surface of the single-sided copper-clad laminate on which the copper layer is not formed, lamination treatment is performed for one minute under conditions of 140° C. and lamination pressure 0.4 MPa using a laminator (product name "Vacuum Laminator V-130", manufactured by Nikko-Materials Co., Ltd.), and a copper-clad laminate precursor is obtained.

The obtained copper-clad laminate precursor is thermo-compression-bonded for ten minutes under conditions of 300° C. and 4.5 MPa using a thermocompression bonder (product name "MP-SNL", manufactured by Toyo Seiki Seisaku-sho, Ltd.), whereby a double-sided copper-clad laminate is obtained.

The single-sided copper-clad laminate and the double-sided copper-clad laminate described above are used, and a flexible printed circuit (FPC) having an outer-layer plane (ground layer) four-layered stripline structure is produced.

Forming Step of Substrate with Wiring Patterns

The copper layer of the double-sided copper-clad laminate is patterned by a known photofabrication method to prepare a substrate with wiring patterns including three pairs of signal lines. A length of the signal line is 100 mm, and a width of the signal line is set such that characteristic impedance is 50Ω.

Lamination Step

The above-described substrate with wiring patterns and a pair of single-sided copper-clad laminates are used, and the single-sided copper-clad laminate, the substrate with wiring patterns, and the single-sided copper-clad laminate are superimposed in this order such that the film side of the single-sided copper-clad laminate is in contact with the substrate with wiring patterns. Lamination is performed at a press temperature of 160° C. using a vacuum press apparatus, and a flexible printed circuit (FPC) is obtained.

Evaluation regarding distortion of wiring is performed using the produced flexible printed circuit (FPC). An evaluation method is as follows. An evaluation result is shown in Table 1.

Wiring Distortion

The flexible printed circuit (FPC) is embedded in UV resin and is cut with a microtome to produce a sample for cross section evaluation. A cross section exposed by the cutting is observed with an optical microscope. Distortion of wiring is evaluated based on the following evaluation standard.

A: No distortion is recognized in the signal lines and the ground line.

B: While no distortion is recognized in the signal lines, distortion is recognized in the ground line.

C: Distortion is recognized in a pair of signal lines.

D: Distortion is recognized in two pairs or three pairs of signal lines.

The elastic modulus of the second resin layer is measured using the produced flexible printed circuit (FPC). A measurement method is as follows.

Elastic Modulus

The flexible printed circuit (FPC) is embedded in UV resin and is cut with a microtome to produce a sample for cross section evaluation. Successively, a cross section exposed by the cutting is observed in a VE-AFM mode using a scanning probe microscope (product name "SPA400", SII NanoTechnology Inc.), and the elastic modulus is measured.

Surface Energy

The surface energy of the side of the first resin layer on which the second resin layer is disposed is calculated by the Owens-Wendt method before the second resin layer is provided.

TABLE 1

| | First Resin Layer | | | | | | | Second Resin Layer | | | | |
|---|---|---|---|---|---|---|---|---|---|---|---|---|
| | Layer A | | | | | Layer B | | | | | | |
| | Aromatic Polyester Amide | | Epoxy Resin | | | Aromatic Polyester Amide Type | Thickness [µm] | Surface Energy [mN/m] | Type | Thickness [µm] | Elastic Modulus (25° C.) [MPa] | Elastic Modulus (160° C.) [MPa] | Wiring Distortion |
| | Type | Content [% by mass] | Type | Content [% by mass] | Thickness [µm] | | | | | | | | |
| Example 1 | A1 | 97.6 | B1 | 2.4 | 3 | A1 | 45 | 33 | C1 | 20 | 100 | 5 | A |
| Example 2 | A1 | 97.6 | B1 | 2.4 | 3 | A1 | 45 | 33 | C2 | 20 | 800 | 10 | A |
| Example 3 | A1 | 97.6 | B1 | 2.4 | 3 | A1 | 45 | 33 | C3 | 20 | 500 | 50 | A |
| Example 4 | A1 | 97.6 | B1 | 2.4 | 3 | A1 | 45 | 33 | C4 | 20 | 1000 | 100 | B |
| Example 5 | — | — | — | — | — | A1 | 45 | 33 | C1 | 20 | 100 | 5 | A |
| Example 6 | — | — | — | — | — | A1 | 45 | 33 | C2 | 20 | 800 | 10 | A |
| Example 7 | — | — | — | — | — | A1 | 45 | 33 | C3 | 20 | 500 | 50 | A |
| Example 8 | — | — | — | — | — | A1 | 45 | 33 | C4 | 20 | 1000 | 100 | B |
| Comparative Example 1 | A1 | 97.6 | B1 | 2.4 | 3 | A1 | 45 | 33 | — | — | — | — | D |
| Comparative Example 2 | — | — | — | — | — | A1 | 45 | 33 | — | — | — | — | D |

As shown in Table 1, in Example 1 to Example 8, since the film includes the first resin layer containing aromatic polyester amide, and the second resin layer disposed on the first resin layer, and the elastic modulus of the second resin layer at 160° C. is less than 1.0 GPa, wiring distortion is suppressed. Adhesiveness of the first resin layer and the second resin layer is excellent.

On the other hand, in Comparative Example 1 and Comparative Example 2, since no second resin layer is formed, wiring distortion is recognized.

What is claimed is:

1. A film comprising:
a first resin layer comprising an aromatic polyester amide; and
a second resin layer disposed on the first resin layer,
wherein an elastic modulus of the second resin layer at 160° C. is less than 1.0 GPa.

2. The film according to claim 1,
wherein a ratio of an elastic modulus of the second resin layer at 25° C. to the elastic modulus of the second resin layer at 160° C. is equal to or greater than 10.

3. The film according to claim 1,
wherein a thickness of the second resin layer is 5 µm to 50 µm.

4. The film according to claim 1,
wherein a surface energy of a side of the first resin layer on which the second resin layer is disposed is equal to or greater than 25 mN/m.

5. The film according to claim 1, wherein:
the aromatic polyester amide comprises a unit represented by Formula 1, a unit represented by Formula 2, and a unit represented by Formula 3; and
with respect to a total content of the unit represented by Formula 1, the unit represented by Formula 2, and the unit represented by Formula 3,
the unit represented by Formula 1 has a content of 30% by mol to 80% by mol,
the unit represented by Formula 2 has a content of 10% by mol to 35% by mol, and
the unit represented by Formula 3 has a content of 10% by mol to 35% by mol:

$$—O—Ar^1—CO—$$ Formula 1

$$—CO—Ar^2—CO—$$ Formula 2

$$—NH—Ar^3—O—$$ Formula 3 wherein in Formula 1 to Formula 3, $Ar^1$, $Ar^2$, and $Ar^3$ each independently represent a phenylene group, a naphthylene group, or a biphenylylene group.

6. The film according to claim 1,
wherein the elastic modulus of the second resin layer at 160° C. is equal to or less than 100 MPa.

7. A wiring board comprising:
a substrate;
a wiring pattern comprising wires and disposed on at least one surface of the substrate;
a second resin layer disposed on the wiring pattern so as to cover spaces between the wires and on the wires; and
a first resin layer disposed on the second resin layer,
wherein the first resin layer comprises an aromatic polyester amide, and
an elastic modulus of the second resin layer at 160° C. is less than 1.0 GPa.

8. The wiring board according to claim 7,
wherein a thickness of the wiring pattern is 3 µm to 40 µm.

9. The wiring board according to claim 7,
wherein the elastic modulus of the second resin layer at 160° C. is equal to or less than 100 MPa.

10. A method for manufacturing a wiring board, the method comprising:

superimposing, on wires of a wiring pattern disposed on a substrate, a resin substrate comprising an aromatic polyester amide;

heating the substrate with the wiring pattern and the resin substrate in a superimposed state to obtain a wiring board, wherein a region from a surface on a side on which the substrate with the wiring pattern is superimposed to a thickness position corresponding to a thickness of the wiring pattern in the resin substrate has an elastic modulus less than 1.0 GPa at a heating temperature at a time of the heating in the superimposed state.

* * * * *